United States Patent [19]

Krolak et al.

[11] 4,242,721
[45] Dec. 30, 1980

[54] ELECTRICAL CONNECTOR ASSEMBLY FOR INTERCONNECTING REMOTE SIGNAL STATIONS TO CENTRAL SIGNAL PROCESSING SYSTEMS

[75] Inventors: Ronald F. Krolak, North Riverside; Jay Perna, Naperville; Frederick J. Radloff, Northlake, all of Ill.

[73] Assignee: Bunker Ramo Corporation, Oak Brook, Ill.

[21] Appl. No.: 843,923

[22] Filed: Oct. 20, 1977

[51] Int. Cl.³ .............................................. H05K 7/14
[52] U.S. Cl. .................................... 361/415; 179/98
[58] Field of Search .......................... 307/112, 115, 42; 361/392, 393, 394, 395, 380, 415; 211/41, 26; 174/52; 179/98

[56] References Cited

U.S. PATENT DOCUMENTS

| 2,777,893 | 1/1957 | De Rosso | 174/52 |
| 3,465,891 | 9/1969 | De Rose | 211/41 |
| 3,676,746 | 7/1972 | Kassabgi | 361/415 |
| 3,755,630 | 8/1973 | Boyer | 179/98 |
| 3,769,552 | 10/1973 | Cook | 361/393 |

Primary Examiner—L. T. Hix
Assistant Examiner—S. D. Schreyer
Attorney, Agent, or Firm—F. M. Arbuckle; T. J. Haller

[57] ABSTRACT

An electrical connector assembly which selectively receives a plurality of impedance networks enables selective interconnection of a plurality of remote signal stations having predetermined signal characteristics to a central signal processing system. The assembly includes a housing means comprising plural sidewalls and a bottom wall for defining a receiving cavity. A first multiple contact means within the cavity has a first plurality of contacts which are adapted for connection to the central signal processing system and a second multiple contact means within the cavity has a second plurality of contacts which are adapted for connection to the remote signal stations. A plurality of intermediate multiple contact means, each having a third plurality of contacts adapted for selective and independent connection to the impedance networks are also within the cavity. Circuit means interconnect selected ones of the first, second and third plurality of contacts to enable interconnection of respective remote signal stations to the central signal processing system as the third plurality of contacts are coupled to the respective impedance networks. A support means within a cavity supports the networks within the housing.

Also disclosed is an embodiment in which the second multiple contact means comprises a plurality of electrical connectors each being adapted for connection to a respective given one of the remote signal stations.

38 Claims, 6 Drawing Figures

FIG. 4

ELECTRICAL CONNECTOR ASSEMBLY FOR INTERCONNECTING REMOTE SIGNAL STATIONS TO CENTRAL SIGNAL PROCESSING SYSTEMS

RELATED APPLICATIONS

This application is related to Application Ser. No. 770,805, filed Feb. 22, 1977, issued as U.S. Pat. No. 4,103,985 on Aug. 1, 1978 in the names of Ronald F. Krolak and Frederick J. Radloff and Application Ser. No. 843,922, filed Oct 20, 1977 in the names of the same inventors, both of which are assigned to the assignee of the present invention.

BACKGROUND OF THE INVENTION

The present invention is directed generally to electrical connector assemblies and, more particularly, to improved electrical connector assemblies which may be, for example, advantageously applied to the selective interconnection of a plurality of remote signal stations to a central signal processing system wherein the remote signal stations have a predetermined signal characteristic.

During the installation and interconnection of remote signal stations such as, for example, modems and data sets to central signal processing systems, such as a telephone central office, it is often observed that the transmitted signal levels of the remote stations and the central systems are so high that overloading of remote station and central system receivers will result unless affirmative measures are taken to attenuate the signals. This results because the remote stations and central systems are designed to have a predetermined signal characteristic in the form of high level transmitted signals to insure that the signals between remote stations and central systems that are at a maximum distance from each other will be received properly. When the remote stations and the central systems are closer in proximity to each other than the maximum distance, the resulting signal levels will be too high and overloading will result. Obviously, the degree of required attenuation is inversely related to the distance between the remote stations and the central systems.

The required attenuation is customarily introduced between the remote stations and the central systems at the time the remote stations are installed. The installer may determine the amount of attenuation required by checking the transmission line loss from the site of the remote station back to the central system. Then, when the installer interconnects the remote station to the central system, an appropriate impedance network is connected across the transmission line pair.

The impedance networks take two different forms. One variety is an impedance pad which comprises five resistors and a capacitor. The other variety is merely a single resistor. Both are used in conjunction with data sets, or modems.

The industry has adopted nine attenuation levels. As a result, there are nine different pad networks, and nine different resistor values to select from. Once the loss is measured at the remote station site, the proper one of the nine pads or resistors is selected and connected across the transmission line during the remote station installation.

While the foregoing procedure of installing a remote station appears to be a simple matter, just the opposite has been the case. The electrical connector assemblies which have come heretofore have only allowed the interconnection of one remote station to the central system. As a result, where a plurality of remote stations at a single site are to be connected to a central system, it is necessary for the installer to carry a like plurality of electrical connector assemblies. Also, such electrical connector assemblies do not provide for ease of installation. Usually, an impedance network must be secured within an enclosure with screws or other fasteners and then wired to obtain the desired interconnection. Where more than one interconnection is necessary, the foregoing process can take considerable time, is error prone, and adds to the installation costs.

Preferably, electrical connector assemblies of the type to which the present invention is directed should be capable of easy and error-free installation coupled with reliable operation. Furthermore, the assemblies must be creatively designed to provide a wide range of flexibility in the interconnecting of remote signal stations and central signal processing systems while retaining simplicity in installation and a relatively modest initial manufacturing cost.

It is therefore a general object of the present invention to provide new and improved electrical connector assemblies for interconnecting a plurality of remote signal stations to central signal processing systems.

It is a more particular object of the present invention to provide electrical connector assemblies which afford simplified and flexible interconnection of remote signal stations and central signal processing systems.

It is a further object of the present invention to provide an electrical connector assembly which is adapted to receive a plurality of impedance networks for interconnecting a like plurality of remote signal stations to a central signal processing system which minimizes the amount of on-site wiring by the installer in establishing the interconnections.

SUMMARY OF THE INVENTION

The invention provides an electrical connector assembly for selectively receiving a plurality of impedance networks and for selectively interconnecting a plurality of remote signal stations having predetermined signal characteristics to a central signal processing system. The assembly comprises a housing including plural sidewalls and a bottom wall for defining a receiving cavity, first multiple contact means within the cavity including a first plurality of contacts adapted for connection to the central signal processing system and a second multiple contact means within the cavity including a second plurality of contacts adapted for connection to the remote signal stations. The assembly also includes a plurality of intermediate multiple contact means within the cavity, each intermediate multiple contact means including a third plurality of contacts adapted for selective and independent connection to an impedance network, circuit means within the cavity for interconnecting selected ones of the first, second and third plurality of contacts and for interconnecting respective remote signal stations to the central signal processing system as each third plurality of contacts is coupled to an impedance network and support means within the cavity for supporting the impedance networks within the housing means.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, and in which:

FIG. 4 is a perspective view of another electrical connector assembly embodying the present invention;

DESCRIPTION OF THE PREFERRED EMBODIMENT

Figure 1:
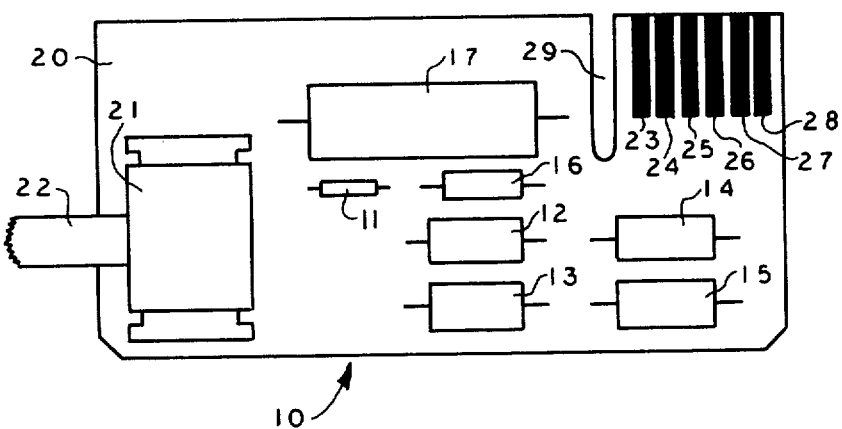
FIG. 1 is a top plan view of an impedance network which may be utilized in practicing the present invention.

Referring now to FIG. 1, FIG. 1 shows an impedance network which may be utilized in practicing the present invention. The impedance network shown in FIG. 1 is of the type which includes a first network circuit including a single impedance element which may be utilized for interconnecting a telephone remote signal station to a central signal processing system and a second network circuit taking the form of an impedance pad circuit comprising a plurality of impedance elements which is suitable for interconnecting a modem or data set to a central signal processing system. The first network circuit of the impedance network generally designated at 10 includes a single impedance element comprising a one-quarter watt resistor 11. The second network circuit comprises four two-watt resistors 12, 13, 14, 15, a one-watt resistor 16, and a capacitor 17. The components of the first and second network circuits are mounted on a substrate comprising a printed circuit board 20 which includes on its under side a deposited lead pattern (not shown) interconnecting the component parts to form the second network circuit or pad circuit and interconnecting the first network circuit single impedance element in circuit. The impedance network also includes a switch 21 mounted on board 20. Switch 21 is provided to selectively actuate the second network circuit or pad circuit should that mode of operation be desired. The switch 21 has a control arm 22 which extends beyond the periphery of the board 20.

The board 20 also carries external contacts 23 through 28 which are coupled to portions of the impedance network circuits by the deposited lead pattern on the underside of the board 20. The external contacts 23 through 28 are utilized for interconnecting a remote signal station to a central signal processing system in a manner to be more fully described hereinafter. The board 20 also includes a slot 29 which provides the primary function of aligning the external contacts 23 through 28 with respective contacts carried by a mating electrical connector.

Figure 2:
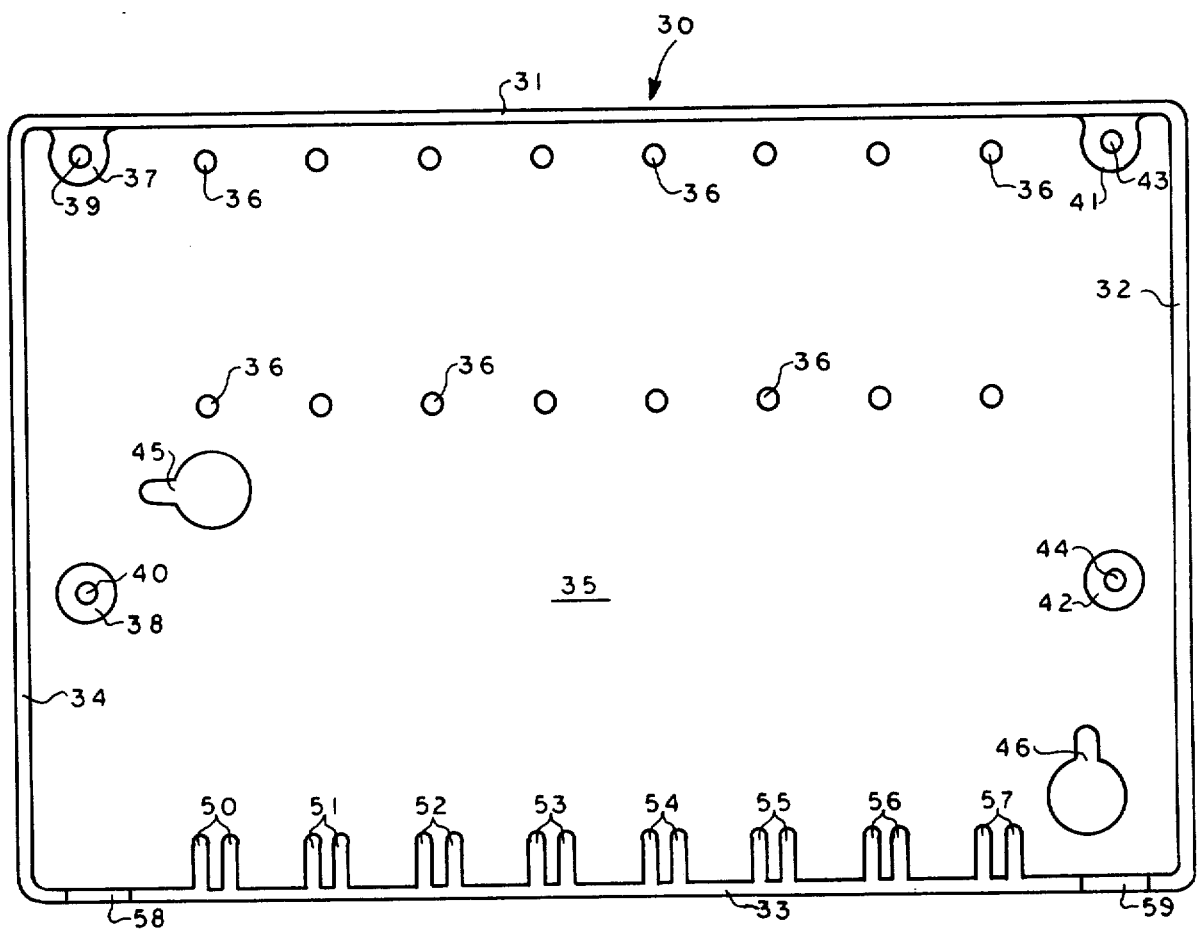
FIG. 2 is a top plan view of a housing embodying the present invention.

Referring now to FIG. 2, FIG. 2 shows a housing 30 which is structured for selectively receiving a plurality of the impedance networks shown in FIG. 1 and suitable electrical connectors for interconnecting a plurality of remote signal stations to a central signal processing system. The housing 30 includes a plurality of sidewalls 31, 32, 33 and 34 and a bottom wall 35 to thereby define a receiving cavity. The bottom wall 35 includes a plurality of apertures 36 which are arranged for receiving screws or the like for securing a plurality of multiple contact intermediate electrical connectors within the receiving cavity on the bottom wall 35. A first pair of mounting posts 37 and 38 are provided for supporting a multiple contact ribbon type connector such as the Amphenol 57 Series connector within the receiving cavity. The posts 37 and 38 include center bores 39 and 40 for receiving threaded screws for securing one such connector. Post 37 as shown is integrally formed with sidewall 31 for increased rigidity. In a similar manner, a second pair of posts 41 and 42 are provided having central bores 43 and 44 for supporting another such connector.

Also within bottom wall 35 are a pair of key slots 45 and 46. The key slots 45 and 46 provide means for mounting the housing 30 on a vertical support such as a wall through the use of properly spaced screws or the like.

Along sidewall 33 is a plurality of vertical rib pairs 50 through 57 which comprise support means within the cavities for supporting the impedance networks within the housing 30. As shown, the rib pairs extend parallel to one another along sidewall 30 and define a substrate confining space between the ribs of each pair for vertically supporting the impedance networks with respect to bottom wall 35. The rib pairs are so spaced so that each rib pair supports one of the impedance networks.

The housing 30 also includes a pair of slots 58 and 59. Slot 58 is provided to give access to a central signal processing system cable to within the housing 30. Slot 59 is similarly shaped for receiving a multi-conductor cable having conductors connected to the remote signal stations to be interconnected with the central signal processing system.

Figure 3:
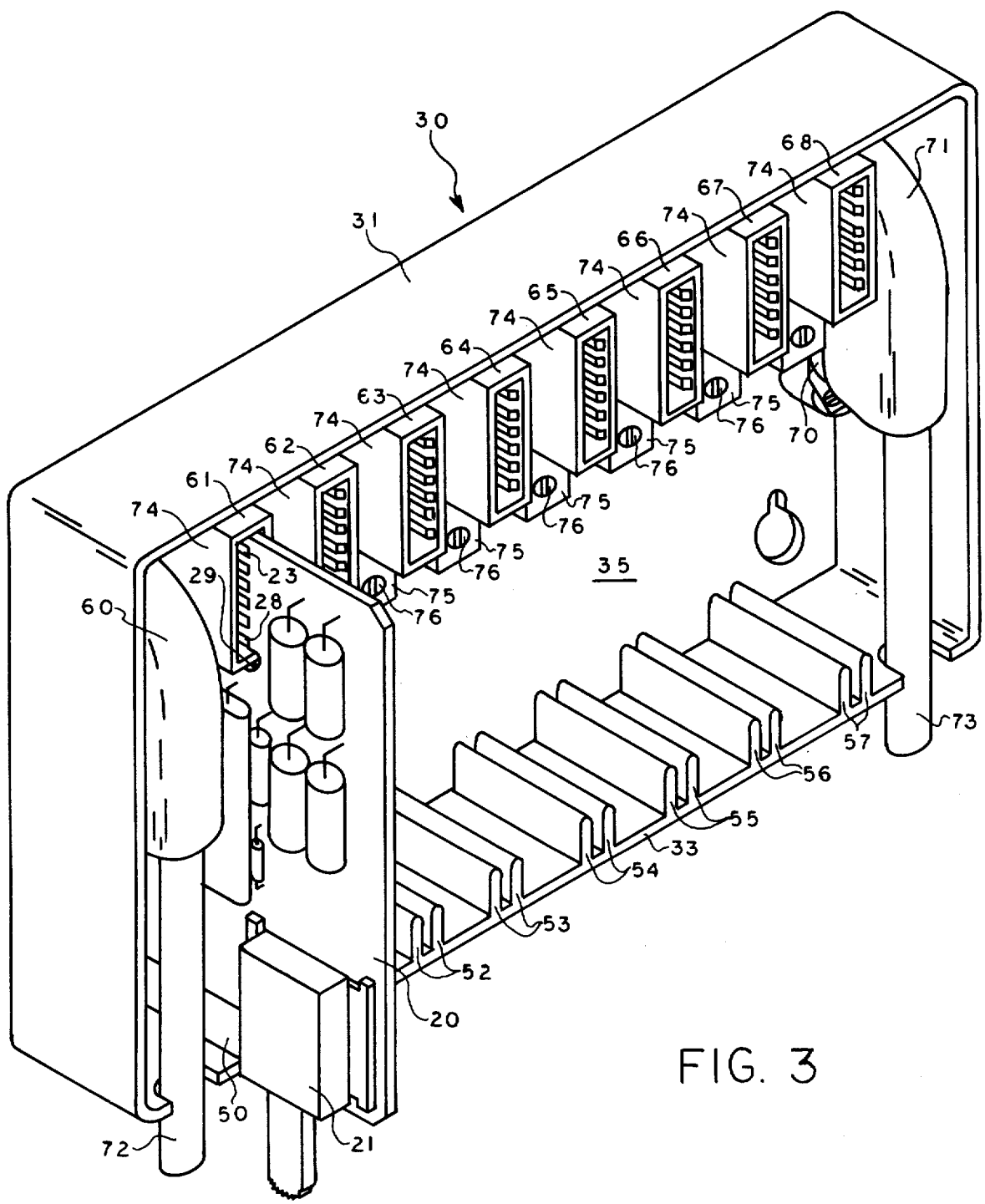
FIG. 3 is a perspective view of an electrical connector assembly embodying the present invention.

Referring now to FIG. 3, it shows an electrical connector assembly which utilizes the housing means 30 of FIG. 2 and is constructed in accordance with the present invention. The assembly of FIG. 3 includes a first multiple contact means, such as an Amphenol 57 Series connector mated to its mating hooded connector half 60, a plurality of intermediate multiple contact means comprising a plurality of multiple contact connectors 61 through 68 and a second multiple contact means 70, such as an Amphenol 57 Series connector, which is shown mated to its mating hooded connector half 71.

The first multiple contact means 69 (FIGS. 5 and 6) includes a first plurality of contacts which are adapted for connection to the central signal processing system by the mating connector half 60 of the multiple conductor central signal processing system cable 72. As well known, the Amphenol 57 Series connector comprises 50 contacts which are arranged in two parallel rows.

In a similar manner, the second multiple contact means 70 includes a second plurality of contacts (50 contacts in the case of an Amphenol 57 Series connector) which are adapted for connection to the remote signal stations by its mating connector half 71 and the multi-conductor cable 73. Each of the intermediate multiple contact means connectors 61 through 68 includes a third plurality of contacts. Specifically, each of the connectors 61 through 68 includes six contacts which are arranged to pinch the external contacts 23 through 28 of the printed circuit board 20 of FIG. 1 for making good electrical contact with the external contacts.

The connectors 61 through 68 are arranged along sidewall 31 opposite the sidewall 33 which contains the parallel support rib pairs 50 through 57. Each connector 61-68 is immediately opposite and aligned with a respective given one of the parallel rib pairs. Each of the connectors 61 through 68 also includes a rectangular body portion 74 and a base portion 75 which are secured to the bottom wall 35 by screws 76 which extend through bores in the base portions 75 and into the apertures 36 (FIG. 2) of the bottom wall 35.

The electrical connector assembly is pre-wired by circuit means (not shown in FIG. 3) which interconnect selected ones of the first, second and third plurality of contacts so that as the impedance networks are coupled to the third plurality of contacts of each of connectors 61 through 68, respective remote signal stations will be interconnected to the central signal processing system. An impedance network may be coupled to the third plurality of contacts of one of the connectors 61 through 68 by simply sliding the impedance network circuit board 20 into its vertical support position between one of the vertically disposed rib pairs. For example, one such impedance network 20 is shown vertically supported within the housing between rib pairs 50 with its external contacts contacting the third plurality of contacts of connector 61. As the impedance network is slid into place, the slot 29 within printed circuit board 20 receives the bottom wall of rectangular portion 74 of connector 61 so that it may clear the connector and align the external contacts 23 through 28 with respective given ones of the third plurality of contacts of connector 61. In doing so, the impedance network 20 interconnects a respective given one of the plurality of remote signal stations with the central signal processing system. A schematic circuit diagram of the circuit means for accomplishing this end is shown in FIG. 5.

Figure 5:
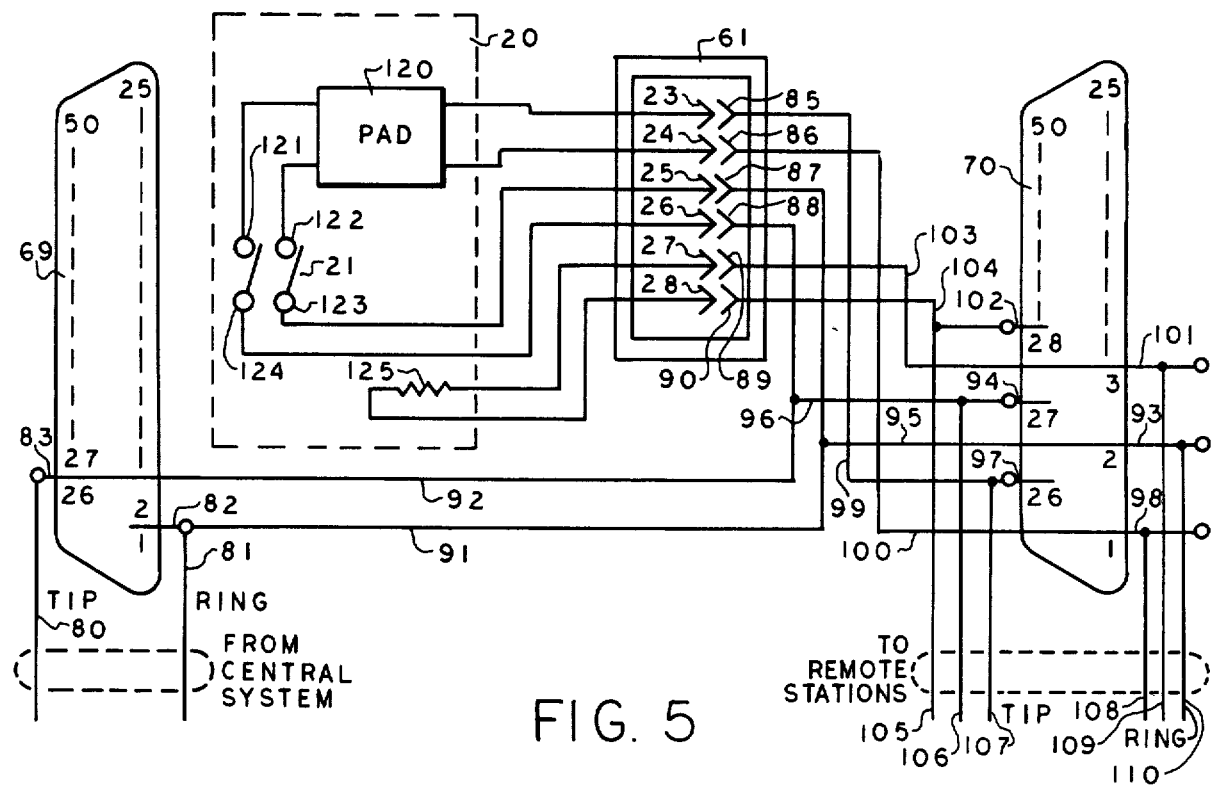
FIG. 5 is a schematic circuit diagram, partially in block form, illustrating a circuit means for wiring the electrical connector assemblies of the present invention for one mode of installation.

The circuit of FIG. 5 shows the pre-wired interconnections of the connectors 69, 61 and 70 for connecting one remote signal station to the central signal processing system. Of course, inasmuch as there are eight connectors, 61 through 68, the circuit of FIG. 5 may be duplicated seven more times to show the complete pre-wiring of the electrical connector assembly for interconnecting a total of eight remote signal stations to the central processing system.

Referring specifically now to FIG. 5, the mating connector half 60 (FIG. 3) connects the tip and ring conductors 80 and 81 respectively to contacts 82 and 83 of connector 69. The contacts 82 and 83 are coupled to contacts 87 and 88 respectively of the third plurality of contacts 85 through 90 of connector 61 by leads 91 and 92 respectively. Contacts 87 and 88 are in turn coupled to contacts 93 and 94 respectively of connector 70 by leads 95 and 96 respectively. Contacts 85 and 86 of connector 61 are coupled to contacts 97 and 98 respectively by leads 99 and 100 respectively. Contacts 89 and 90 of connector 61 are coupled to contacts 101 and 102 by leads 103 and 104 respectively. The contacts 93, 94, 97, 98, 101 and 102 of connector 70 are coupled to the remote signal station by the mating connector half 71 (FIG. 3) and conductors 105 through 110 of the multiple conductor cable 73.

The lead pattern on the printed circuit board 20 is such that the pad circuit 120 is coupled to external contacts 23 and 24 and to switch terminals 121 and 122 of switch 21. The lead pattern also connects switch terminals 123 and 124 to contacts 25 and 26 respectively and connects the single impedance element 125 across contacts 27 and 28. When the impedance network 20 is slid into its vertical support position, contacts 23 through 28 mate and make electrical connection with contacts 85 through 90 respectively of connector 61.

With the electrical connector assembly being pre-wired as shown in FIG. 5, and with the conductive lead pattern of the printed circuit board connecting the pad 120, switch 21, and single impedance element 125 to its external contacts 23 through 28 as shown, all of the requirements found in the rules and regulations, Appendix A-59 appearing in the Federal Register, Vol. 41, No. 134, dated Monday, July 12, 1976, will be satisfied. Also as a result, with the connector assembly being pre-wired as shown, those requirements are satisfied at the instant the printed circuit board 20 is slid into its vertical support position. Hence, in establishing the interconnection between a remote signal station and a central signal processing system by utilizing the present invention, no on-site installation wiring is required. Also, any number of remote signal stations may be interconnected to the central signal processing system in this manner. It might be mentioned that this embodiment shows the electrical connector assembly having the capacity of interconnecting eight remote signal stations to the central signal processing system because connector 70 includes 50 contacts and each remote signal station requires six of the contacts. Of course, with connectors having many more contacts, any number of remote signal stations may be interconnected to a central signal processing system in this same manner without departing from the present invention.

For those installations which require only the single impedance element, a printed circuit board configured in the same shape as printed circuit board 20 of FIG. 1 may be utilized but having a pair of screw terminals for receiving the single impedance element and for connecting the impedance element across the appropriate external contacts of the board. In such a case, the electrical connector assembly may be pre-wired in the manner shown in FIG. 6. As with the circuit of FIG. 5, for this mode of operation, contacts 82 and 83 of connector 69 are coupled to contacts 87 and 88 respectively of connector 61 by leads 91 and 92 respectively. Contacts 87 and 88 are likewise connected to contacts 93 and 94 of connector 70 by leads 95 and 96 respectively. Also, contacts 89 and 90 of connector 61 are coupled to contacts 101 and 102 by leads 103 and 104. Lastly, the single impedance element 125 is coupled across contacts 27 and 28 by the lead pattern on the printed circuit board. When the printed circuit board is then inserted into its support position, contacts 27 and 28 will contact contacts 89 and 90. This will satisfy the requirements found at Appendix A-60 of the previously referred to Federal Rules and Regulations.

It is also to be noted that the manner in which the electrical connector is pre-wired in accordance with FIG. 5, satisfies both conditions. Therefore, only one electrical connector assembly is required for satisfying both requirements.

Figure 4:
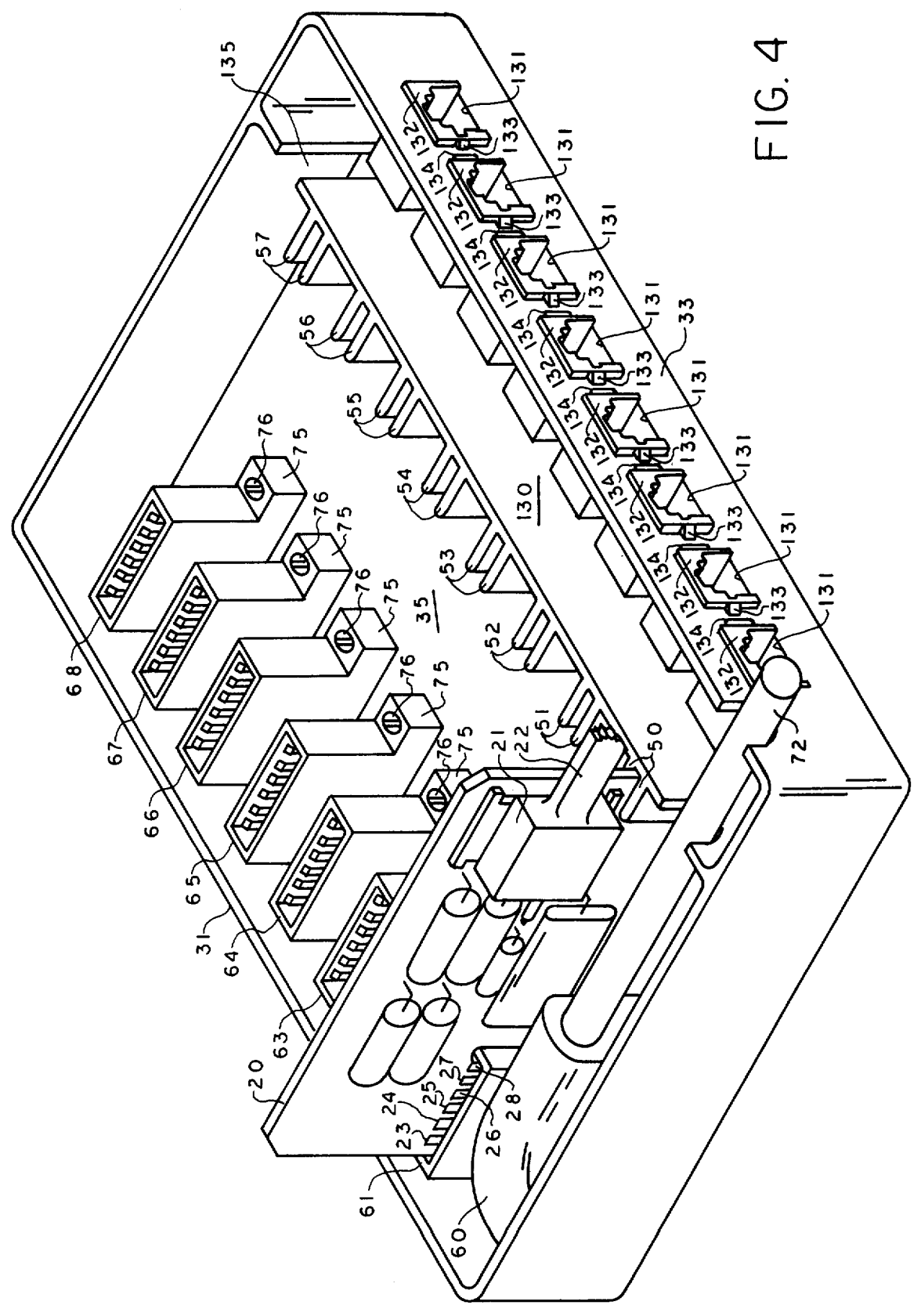

FIG. 4 shows another electrical connector assembly constructed in accordance with the present invention. It includes the first multiple contact means connector connected to its hooded mating connector half 60 which is in turn coupled to the central signal system cable 72. The electrical connector assembly of FIG. 4 also includes the plurality of intermediate multiple contact connectors 61 through 68 which are secured to bottom wall 35 by screws 76. The housing of FIG. 4 includes a partition wall 130 which is parallel to and spaced from sidewall 33. Partition wall 130 carries the plurality of support rib pairs 50 through 57. As shown, rib pair 50 supports printed circuit board 20 with its contacts 23 through 28 making electrical connection with the third plurality of contacts contained within connector 61.

The electrical connector assembly of FIG. 4 further includes a plurality of apertures 131 which are dimensioned for receiving the snap-in type connectors 132 which are fully described and claimed in copending patent application Ser. No. 770,805, filed Feb. 22, 1977, in the names of Ronald Krolak and Frederick Radloff, which is also assigned to the assignee of the present invention. The electrical connectors 132 as described and claimed in the afore-mentioned copending application, include a ramped boss 133 carried on opposite sides of the forward portion of the connector which cooperate with adjacent slots 134 for snap-locking into place. Each of the connectors 132 carries either six or eight contacts and are arranged for mating with a complementary connector associated with the remote signal stations. As a result, the plurality, of connectors 132 comprise the second multiple contact means previously referred to and the totality of the contacts carried by the connectors 132 comprise the second plurality of contacts.

Because partition wall 130 is spaced from sidewall 33, a wire receiving cavity is formed between partition wall 130 and sidewall 33 to allow wires to be placed therein for pre-wiring the electrical connector assembly preferably in the manner shown in FIG. 5 with one modification as described below. A gap 135 in partition wall 130 provides access to the wire receiving cavity between partition wall 130 and sidewall 33 for the circuit wires.

The electrical connector assembly of FIG. 4 is therefore adapted to provide interconnection for a plurality of remote signal stations each having its own multi-conductor cable which is terminated with a connector suitable for mating with the connectors 132. As a result, each of the remote signal stations may be independently interconnected to the central signal system as the respective printed circuit boards 20 containing the impedance networks are slid into their support positions and thereby interconnected with the third plurality of contacts carried by the connectors 61 through 68.

Figure 6:
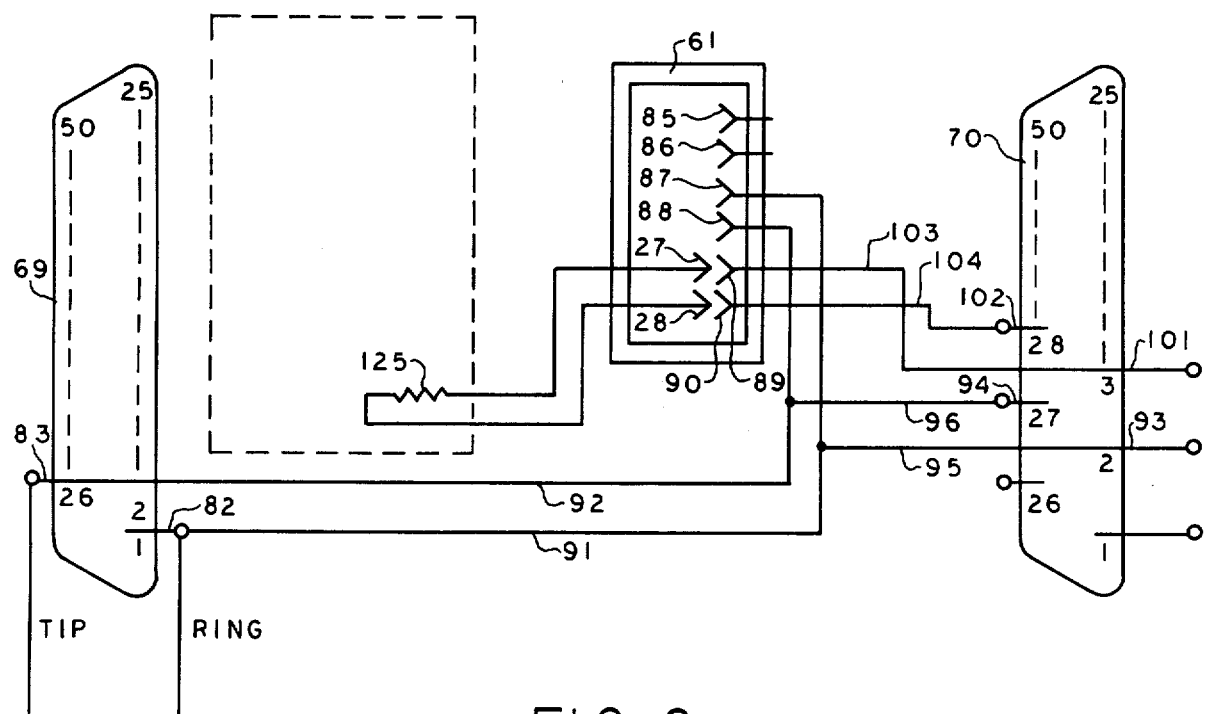
FIG. 6 is a schematic circuit diagram illustrating another circuit means for wiring the electrical connector assemblies of the present invention for another mode of installation.

As a convenience, the control arm 22 of each switch 21 extends in an aligned relation with the electrical connector 132 to which its impedance network is associated so that an installer may easily determine which switches affect the respective remote signal stations. Also, as in the previous embodiment, the electrical connector assembly of FIG. 4 may be wired as shown by the schematic of FIG. 6 with the modification described below if only a single impedance element is to be utilized for providing the required attenuation. However, should an impedance network of the type shown in FIG. 1 be required, the electrical connector assembly must be wired in accordance with the circuit diagram of FIG. 5 with modification, which as previously explained will accommodate both types of impedance network printed circuit boards.

When the embodiment of FIG. 4 is utilized, the wiring as illustrated in FIGS. 5 and 6 must be modified slightly in order to satisfy F.C.C. requirements for Universal Service Order Code (U.S.O.C.) RJ41M through RJ47M, Multiple Bridged T/R; 8 Position Keyed Data Jacks—Universal and Programmed; Title 47, ch. 1, part 68, Appendix A-58 (see the Federal Register, Vol. 41, No. 134, July 12, 1976). To satisfy these requirements two conductor control leads (not illustrated) must be electrically connected in conventional form between two contacts of each connector 132 and two contacts of the connector half 60 (FIG. 4). Such control leads, however, are not required when using a multiple connector 71 with the connector half 60 as shown in FIG. 3.

The invention therefore provides an improved electrical connector assembly for interconnecting a plurality of remote signal stations to a central signal processing system. Because the electrical connector assemblies may be pre-wired by circuit means for accommodating slide-in impedance networks to interconnect the remote signal stations to the central signal processing system, the electrical connector assemblies of the present invention provide the installer with improved ease of installation of the remote signal stations. Also, because a plurality of remote signal stations may be interconnected through the use of one housing, considerable savings are afforded over prior art systems wherein a separate electrical connector assembly is required for each interconnection of a remote signal station to a central signal processing system. As a result of the foregoing, the electrical connector assemblies of the present invention not only provide for error-free installation of remote signal stations but also economical and reliable service.

While particular embodiments of the present invention have been shown and described, modifications may be made, and it is intended in the appended claims to cover all such modifications that fall within the true spirit of the invention.

We claim:

1. An electrical connector assembly for selectively receiving a plurality of impedance networks and for selectively interconnecting a plurality of remote signal stations having predetermined signal characteristics to a central signal processing system, comprising:
  housing means including plural sidewalls and a bottom wall for defining a receiving cavity;
  first multiple contact means within said cavity including a first plurality of contacts adapted for connection to the central signal processing system;
  second multiple contact means within said cavity including a second plurality of contacts correspondingly associated with said first plurality of contacts and adapted for connection to the remote signal stations;
  a plurality of intermediate multiple contact means within said cavity, each said intermediate multiple contact means including a third plurality of contacts correspondingly associated with said first and second plurality of contacts and adapted for selective and independent connection to an impedance network;
  circuit means within said cavity for interconnecting corresponding contacts of said first, second and third plurality of contacts and for interconnecting correspondingly associated remote signal stations to the central signal processing system as each said third plurality of contacts is coupled to an impedance network;

support means within said cavity for supporting the impedance networks within said housing means; and one of said sidewalls being associated with said second multiple contact means and said housing including a partition wall spaced from said one sidewall with said support means being associated with said partition wall.

2. An electrical connector assembly as defined in claim 1 wherein each said third plurality of contacts includes a first set of contacts and a second set of contacts, said first set of contacts being adapted for connection to a first network circuit comprising a single impedance element and said second set of contacts being adapted for connection to a second network circuit comprising multiple impedance elements.

3. An electrical connector assembly as defined in claim 2 wherein said networks comprise said first and second circuits mounted on an insulating substrate and switching means coupled to said second circuit and to said second set of contacts for providing selective actuation of said second circuit.

4. An electrical connector assembly as defined in claim 1 wherein said support means comprises a plurality of substantially parallel ribs along one of said sidewalls for vertically supporting said networks with respect to said bottom wall.

5. An electrical connector assembly as defined in claim 4 wherein said ribs are arranged in pairs for supporting a single network between each of said rib pairs.

6. An electrical connector assembly as defined in claim 1 wherein each of said intermediate multiple contact means comprises a multiple contact connector.

7. An electrical connector assembly as defined in claim 6 wherein said support means comprises a plurality of substantially parallel ribs along one of said sidewalls for supporting said networks vertically with respect to said bottom wall.

8. An electrical connector assembly as devined in claim 7 wherein said ribs are arranged in pairs, wherein said multiple contact connectors are opposite said rib pairs, and wherein said networks include external contacts arranged so that as said networks are inserted between said rib pairs, said external contacts mate with said multiple contact connector contacts.

9. An electrical connector arrangement as defined in claim 8 wherein each said multiple contact connector includes a body, and wherein said networks also include an alignment slot within said substrates for coacting with a respective connector body to align said external contacts with said multiple contact connector contacts.

10. An electrical connector assembly as defined in claim 9 wherein said multiple contact connectors are mounted along the sidewall opposite said one sidewall.

11. An electrical connector assembly as defined in claim 1 wherein one of said sidewalls includes a plurality of apertures and wherein said second multiple contact means comprises a like plurality of electrical connectors, each one of said electrical connectors being supported within a given one of said apertures and having contacts adapted to be electrically connected to a given remote signal station, and wherein said second plurality of contacts comprises said electrical connector contacts.

12. An electrical connector assembly as defined in claim 11 wherein each said third plurality of contacts includes a first set of contacts and a second set of contacts, said first set of contacts being adapted for connection to a first network circuit comprising a single impedance element and said second set of contacts being adapted for connection to a second network circuit comprising multiple impedance elements.

13. An electrical connector assembly as defined in claim 12 wherein said networks comprise said first and second circuits mounted on an insulating substrate and switching means coupled to said second circuit and to said second set of contacts for providing selective actuation of said second circuit.

14. An electrical connector assembly for selectively receiving a plurality of impedance networks and for selectively interconnecting a plurality of remote signal stations having predetermined signal characteristics to a central signal processing system, comprising:

housing means including plural sidewalls and a bottom wall for defining a receiving cavity;

first multiple contact means within said cavity including a first plurality of contacts adapted for connection to the central signal processing system;

second multiple contact means within said cavity including a second plurality of contacts adapted for connection to the remote signal stations;

a plurality of intermediate multiple contact means within said cavity, each said intermediate multiple contact means including a third plurality of contacts adapted for selective and independent connection to an impedance network;

circuit means within said cavity for interconnecting selected ones of said first, second and third plurality of contacts and for interconnecting respective remote signal stations to the central signal processing system as each third plurality of contacts is coupled to an impedance network;

support means within said cavity for supporting the impedance networks within said housing means, one of said sidewalls including a plurality of apertures and wherein said second multiple contact means comprises a like plurality of electrical connectors, each one of said electrical connectors being supported within a given one of said apertures and having contacts adapted to be electrically connected to a given remote signal station, and said housing means including a partition wall parallel to and spaced from said one sidewall with said support means comprising a plurality of substantially parallel ribs along said partition wall for supporting said networks vertically with respect to said bottom wall.

15. An electrical connector assembly as defined in claim 14 wherein said ribs are arranged in pairs for supporting a single network between each of said rib pairs.

16. An electrical connector assembly as defined in claim 11 wherein each of said intermediate multiple contact means comprises a multiple contact connector.

17. An electrical connector assembly for selectively receiving a plurality of impedance networks and for selectively interconnecting a plurality of remote signal stations having predetermined signal characteristics to a central signal processing system, comprising:

housing means including plural sidewalls and a bottom wall for defining a receiving cavity;

first multiple contact means within said cavity including a first plurality of contacts adapted for connection to the central signal processing system;

second multiple contact means within said cavity including a second plurality of contacts adapted for connection to the remote signal stations;

a plurality of intermediate multiple contact means within said cavity, each said intermediate multiple contact means including a third plurality of contacts adapted for selective and independent connection to an impedance network, each of said intermediate multiple contact means comprising a multiple contact connector;

circuit means within said cavity for interconnecting selected ones of said first, second and third plurality of contacts and for interconnecting respective remote signal stations to the central signal processing system as each third plurality of contacts is coupled to an impedance network;

support means within said cavity for supporting the impedance networks within said housing means;

one of said sidewalls including a plurality of apertures and wherein said second multiple contact means comprises a like plurality of electrical connectors, each one of said electrical connectors being supported within a given one of said apertures and having contacts adapted to be electrically connected to a given remote signal station, and said housing means including a partition wall parallel to and spaced from said one sidewall and wherein said support means comprises a plurality of substantially parallel ribs along said partition wall for supporting said networks vertically with respect to said bottom wall.

18. An electrical connector assembly as defined in claim 17 wherein said ribs are arranged in paris, wherein said multiple contact connectors are opposite said partition wall, and wherein said networks include external contacts arranged so that as said networks are inserted between said rib pairs, said external contacts mate with said multiple contact connector contacts.

19. An electrical connector arrangement as defined in claim 18 wherein each said multiple contact connector includes a body, and wherein said networks also include an alignment slot within said substrates for coacting with a respective connector body to align said external contacts with said multiple contact connector contacts.

20. An electrical connector assembly as defined in claim 19 wherein said multiple contact connectors are mounted along the sidewall opposite said one sidewall.

21. An assembly for selectively interconnecting one or more remote signal stations having predetermined signal characteristics to a central signal processing system, comprising:

housing means including plural sidewalls and a bottom wall for defining a receiving cavity;

a first multiple contact means within said cavity including a first plurality of contacts adapted for connection to the central signal processing system;

second multiple contact means within said cavity including a second plurality of contacts correspondingly associated with said first plurality of contacts and adapted for connection to the remote signal stations;

a plurality of intermediate multiple contact means within said cavity, each said intermediate multiple contact means including a third plurality of contacts correspondingly associated with said first and second plurality of contacts;

at least one impedance network for connection to selected ones of said plurality of intermediate multiple contact means;

circuit means within said cavity for interconnecting corresponding contacts of said first, second and third plurality of contacts and for interconnecting a corresponding one of the remote signal stations to the central signal processing system as a corresponding one of said third plurality of contacts is coupled to said impedance network;

support means within said cavity for supporting said impedance networks within said housing means; and one of said sidewalls being associated with said second multiple contact means and said housing including a partition wall spaced from said one sidewall with said support means being associated with said partition wall.

22. An assembly as defined in claim 21 wherein each said impedance network includes a first network circuit comprising a single impedance element and a second network circuit comprising multiple impedance elements and wherein each said third plurality of contacts includes a first set of contacts and a second set of contacts, said first set of contacts being adapted for connection to one of said first network circuits and said second set of contacts being adapted for connection to one of said second network circuits.

23. An assembly as defined in claim 22 wherein said first and second circuits of each said impedance network are mounted on an insulating substrate and wherein said substrate includes switching means coupled to said second circuit and to said second set of contacts for providing selective actuation of said second circuit.

24. An assembly as defined in claim 21 wherein said support means comprises a plurality of substantially parallel ribs along one of said sidewalls for vertically supporting said networks with respect to said bottom wall.

25. An assembly as defined in claim 24 wherein said ribs are arranged in pairs for supporting a single network between each of said rib pairs.

26. An assembly as defined in claim 25 wherein each of said intermediate multiple contact means comprises a multiple contact connector.

27. An assembly as defined in claim 26 wherein said multiple contact connectors are opposite said rib pairs, and wherein said networks include external contacts arranged so that as said networks are inserted between said rib pairs, said external contacts mate with said multiple contact connector contacts.

28. An assembly as defined in claim 27 wherein each said multiple contact connector includes a body, and wherein each said network also includes an alignment slot within said substrate for coacting with a respective connector body to align said external contacts with said multiple contact connector contacts.

29. An assembly as defined in claim 28 wherein said multiple contact connectors are mounted along the sidewall opposite said one sidewall.

30. An assembly as defined in claim 21 wherein one of said sidewalls includes a plurality of apertures and wherein said second multiple contact means comprises a like plurality of electrical connectors, each one of said electrical connectors being supported within a given one of said apertures and having contacts adapted to be electrically connected to a given remote signal station, and wherein said second plurality of contacts comprises said electrical connector contacts.

31. An assembly as defined in claim 30 wherein each said impedance network includes a first network circuit comprising a single impedance element and a second network circuit comprising multiple impedance elements and wherein each said third plurality of contacts includes a first set of contacts and a second set of contacts, said first set of contacts being adapted for connection to one of said first network circuits and said second set of contacts being adapted for connection to one of said second network circuits.

32. An assembly as defined in claim 31 wherein said first and second circuit of each said impedance network are mounted on an insulating substrate and wherein said substrate includes switching means coupled to said second circuit and to said second set of contacts for providing selective actuation of said second circuit.

33. An assembly for selectively interconnecting one or more remote signal stations having predetermined signal characteristics to a central signal processing system, comprising:
  housing means including plural sidewalls and a bottom wall for defining a receiving cavity;
  first multiple contact means within said cavity including a first plurality of contacts adapted for connection to the central signal processing system;
  second multiple contact means within said cavity including a second plurality of contacts adapted for connection to the remote signal stations;
  a plurality of intermediate multiple contact means within said cavity, each said intermediate multiple contact means including a third plurality of contacts;
  at least one impedance network adapted for selective and independent connection to said third plurality of contacts;
  circuit means within said cavity for interconnecting selected ones of said first, second and third plurality of contacts and for interconnecting a respective given one of the remote signal stations to the central signal processing system as a respective given one of said third plurality of contacts is coupled to said impedance network;
  support means within said cavity for supporting said impedance networks within said housing means,
  one of said sidewalls including a plurality of apertures and wherein said second multiple contact means comprises a like plurality of electrical connectors, each one of said electrical connectors being supported within a given one of said apertures and having contacts adapted to be electrically connected to a given remote signal station wherein said second plurality of contacts comprises said electrical connector contacts, and
  said housing means including a partition wall parallel to and spaced from said one sidewall with said support means comprising a plurality of substantially parallel ribs along said partition wall for supporting said networks vertically with respect to said bottom wall.

34. An assembly as defined in claim 33 wherein said ribs are arranged in pairs for supporting a single network between each of said rib pairs.

35. An assembly as defined in claim 34 wherein each of said intermediate multiple contact means comprises a multiple contact connector.

36. An assembly as defined in claim 35 wherein said multiple contact connectors are opposite said rib pairs, and wherein said networks include external contacts arranged so that as said networks are inserted between said rib pairs, said external contacts mate with said multiple contact connector contacts.

37. An electrical assembly as defined in claim 36 wherein each said multiple contact connector includes a body, and wherein each said network also includes an alignment slot within said substrate for coacting with a respective connector body to align said external contacts with said multiple contact connector contacts.

38. An assembly as defined in claim 37 wherein said multiple contact connectors are mounted along the sidewall opposite said one sidewall.

* * * * *